(12) United States Patent
Tihanyi

(10) Patent No.: US 6,541,804 B2
(45) Date of Patent: Apr. 1, 2003

(54) JUNCTION-ISOLATED LATERAL MOSFET FOR HIGH-/LOW-SIDE SWITCHES

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/017,638

(22) Filed: Nov. 21, 2001

(65) Prior Publication Data

US 2002/0096697 A1 Jul. 25, 2002

Related U.S. Application Data

(63) Continuation of application No. PCT/DE00/01492, filed on May 12, 2000.

(30) Foreign Application Priority Data

May 21, 1999 (DE) .......................................... 199 23 466

(51) Int. Cl.$^7$ ................................................ H01L 29/76
(52) U.S. Cl. ........................................ 257/213; 257/219
(58) Field of Search ................................ 257/213, 219, 257/220, 221

(56) References Cited

U.S. PATENT DOCUMENTS

| | | | |
|---|---|---|---|
| 3,649,886 A | 3/1972 | Kooi | |
| 4,132,998 A | 1/1979 | Dingwall | |
| 5,294,824 A | 3/1994 | Okada | |
| 5,348,215 A | 9/1994 | Rafferty et al. | |
| 5,726,469 A | 3/1998 | Chen | |
| 5,831,320 A | 11/1998 | Kwon et al. | |
| 6,146,953 A | * 11/2000 | Lee et al. | 438/289 |
| 6,184,555 B1 | * 2/2001 | Tihanyi et al. | 257/342 |

OTHER PUBLICATIONS

Published International Application No. 97/296518 (Tihanyi et al.), dated Aug. 14, 1997.

"M.O.S. technologies for smart power and high–voltage circuits", Pierre Rossel, L'Onde Electrique, Nov. 1987, Vo. 67, No. 6, pp. 58–69.

* cited by examiner

Primary Examiner—Phat X. Cao
(74) Attorney, Agent, or Firm—Laurence A. Greenberg; Werner H. Stemer; Gregory L. Mayback

(57) ABSTRACT

The junction insulated lateral MOSFET is suitable for high/low side switches. A p-conductive wall between an n-conductive source zone and an n-conductive drain zone, together with the source zone and drain zone, extend to an n-conductive substrate. The source zone and the drain zone are surrounded by a p-conductive area.

4 Claims, 2 Drawing Sheets

JUNCTION-ISOLATED LATERAL MOSFET FOR HIGH-/LOW-SIDE SWITCHES

CROSS-REFERENCE TO RELATED APPLICATION

This application is a continuation of copending International Application No. PCT/DE00/01492, filed May 12, 2000, which designated the United States.

BACKGROUND OF THE INVENTION

Field of the Invention

The present invention lies in the integrated technology field. More specifically, the invention relates to a junction-isolated lateral MOSFET for a high-/low-side switch having a semiconductor body of the first conductivity type having two main surfaces that are essentially opposite one another, wherein case, from the first main surface, a source zone and a drain zone each having the second conductivity type extend at a distance from one another into the semiconductor body, the drain zone and the source zone are surrounded at their outer periphery by a region of the first conductivity type, an insulating layer with a gate electrode is provided on the first main surface in the region between the source zone and the drain zone, and the semiconductor body is grounded on the second main surface.

High-voltage (HV) MOSFETs are widely used in bridge circuits in order to switch relatively small voltages of the order of magnitude of 50 to 100 V or else higher voltages in the circuits. Such HV MOSFETs should be easily integrable and, at the same time, be distinguished by a simple construction. Precisely in the application in bridge circuits, by way of example, an integrated inverse diode should not be necessary for operation of the HV MOSFET.

Therefore, the use of a junction-isolated lateral MOSFET as a switch in bridge circuits has already been described. However, it has not been possible hitherto to configure such a junction-isolated lateral MOSFET in such a way that it can also be used for higher voltages in excess of about 50 to 100 V and, at the same time, can be integrated simply and without a high outlay.

SUMMARY OF THE INVENTION

It is accordingly an object of the invention to provide a junction isolated lateral MOSFET for high/low side switches, which overcomes the above-mentioned disadvantages of the heretofore-known devices and methods of this general type and which can also be used for voltages in excess of 50 to 100 V and is distinguished by a simple structure, so that it can be fabricated without a high outlay.

With the foregoing and other objects in view there is provided, in accordance with the invention, a junction-isolated lateral MOSFET for a high-/low-side switch, comprising:

a semiconductor body of the first conductivity type;

a first main surface and a second main surface substantially opposite the first main surface;

a source zone and a drain zone each of a second conductivity type extending from the first main surface at a distance from one another into the semiconductor body;

a surrounding region of the first conductivity type surrounding the drain zone and the source zone at an outer periphery thereof;

an insulating layer and a gate electrode disposed on the first main surface in a region between the source zone and the drain zone;

a ground connection grounding the semiconductor body at the second main surface;

a region of the first conductivity type extending between the source zone and the drain zone from the first main surface into the semiconductor body, the region of the first conductivity type having a doping concentration between a doping concentration for a breakdown charge and twice the doping concentration for the breakdown charge.

In other words, a junction-isolated lateral MOSFET for high-/low-side switches of the above-mentioned type is provided, between the source zone and the drain zone, with a region of the first conductivity type that extends from the first main surface as far as the semiconductor body.

This region of the first conductivity type preferably has a doping concentration $N_{p1}$, where:

$$N_{DB} < N_{p1} < 2 \cdot N_{DB}$$

where $N_{DB}$ denotes the doping concentration for breakdown charge and is approximately $2 \cdot 10^{12}$ carriers cm$^{-2}$ for silicon.

In accordance with an added feature of the invention, pillar-shaped regions of the first conductivity type extend from the first main surface to the semiconductor body and are embedded in the source zone and the drain zone. That is, it is advantageous that pillar-like regions of the first conductivity type which extend from the first main surface as far as the semiconductor body are incorporated in the source zone and the drain zone. In this case, these pillar-like regions are distributed more or less periodically, the total quantity of the charges in these pillar-like regions and in the source zone and, respectively, in the drain zone being approximately identical in each case.

In accordance with an alternative feature of the invention, pillar-shaped regions of the first conductivity type extend parallel to the first and second main surfaces and they are embedded in the source zone and the drain zone. That is, it is also possible for pillar-like regions of the first conductivity type which extend parallel to the two main surfaces to be incorporated in the source zone and the drain zone. In this case, for the total quantity of the respective dopings, the same holds true as was explained above for the pillar-like regions which extend between the first main surface and the semiconductor body.

In accordance with a concomitant feature of the invention, field plates are provided for the source zone and/or the drain zone. That is, it is also advantageous if the source zone and/or the drain zone are/is provided with field plates. The breakdown strength of the junction-isolated lateral MOSFET can thereby be improved.

The pillar-like regions, when arranged perpendicularly to the main surfaces and when arranged parallel to the latter, act as compensation charge in each case, so that a higher doping of the opposite conductivity type is allowed around these regions. Thus, by way of example, if the semiconductor body is p-conducting, then the source zone and the drain zone are n-conducting, and the region of the first conductivity type between the source zone and the drain zone is p-conducting. Pillar-like p-conducting regions are then incorporated in the source zone and the drain zone, which regions act as compensation charge and thus enable a higher n-doping of the source zone and drain zone.

Other features which are considered as characteristic for the invention are set forth in the appended claims.

Although the invention is illustrated and described herein as embodied in a junction-isolated lateral MOSFET for high-/low-side switches, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic sectional view of the junction-isolated lateral MOSFET of FIG. 1 in a "high-side" state, with the channel being switched on;

DESCRIPTION OF THE PREFERRED EMBODIMENTS

Figure 1:
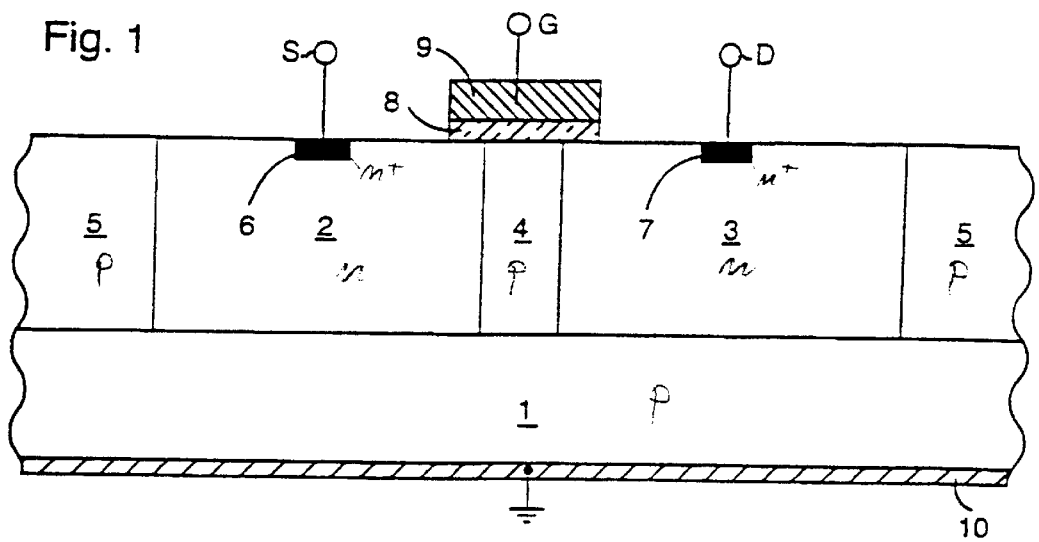
FIG. 1 sectional view through a junction-isolated lateral MOSFET according to the invention.

Referring now to the figures of the drawing in detail and first, particularly, to FIG. 1 thereof, there is shown a first exemplary embodiment or a basic structure of the junction-isolated lateral MOSFET according to the invention. An n-conducting source zone 2 and an n-conducting drain zone 3, which are insulated from one another by a p-conducting region 4, are provided on a semiconductor substrate 1. The substrate 1 is made of silicon of the p conductivity type. The drain zone 2 and the source zone 3 are surrounded on their outer periphery by a p-conducting region 5. In the case of a rectangular structure, the region 5 thus forms an outer frame surrounding the zones 2 and 3, while the region 4 extends between two sides of the region 5 and isolates the zones 2 and 3 from one another.

During the fabrication of the junction-isolated lateral MOSFET of FIG. 1, an epitaxial layer, for example, may be applied to the substrate 1, the zones 2, 3 and the regions 4, 5 then being introduced into said layer by diffusion or implantation.

The source zone 2 and the drain zone 3 each additionally have an $n^+$-conducting connection region 6 and 7, respectively, for a source electrode S and a drain electrode D, respectively.

A gate insulating layer 8 made of silicon dioxide, for example, is situated above the region 4. A gate electrode 9 made of doped polycrystalline silicon with a gate connection G is provided on the gate insulating layer 8.

A contact layer 10 made of aluminum, for example, is situated on that surface of the semiconductor substrate 1 which is opposite to the zones 2, 3 and the regions 4, 5. The contact layer 10 is grounded.

The region 4 representing a wall between the zones 2 and 3 has a doping concentration $N_{p1}$ which lies between the doping $N_{DB}$ for the breakdown charge and twice the doping for the breakdown charge. For silicon, the material of which the semiconductor substrate 1 and the zones 2, 3 and also the regions 4, 5 are composed, the breakdown charge is about $2 \cdot 10^{12}$ charge carriers $cm^{-2}$.

The method of operation of the junction-isolated lateral MOSFET of FIG. 1 will now be explained with reference to FIGS. 2 and 3.

Figure 2:
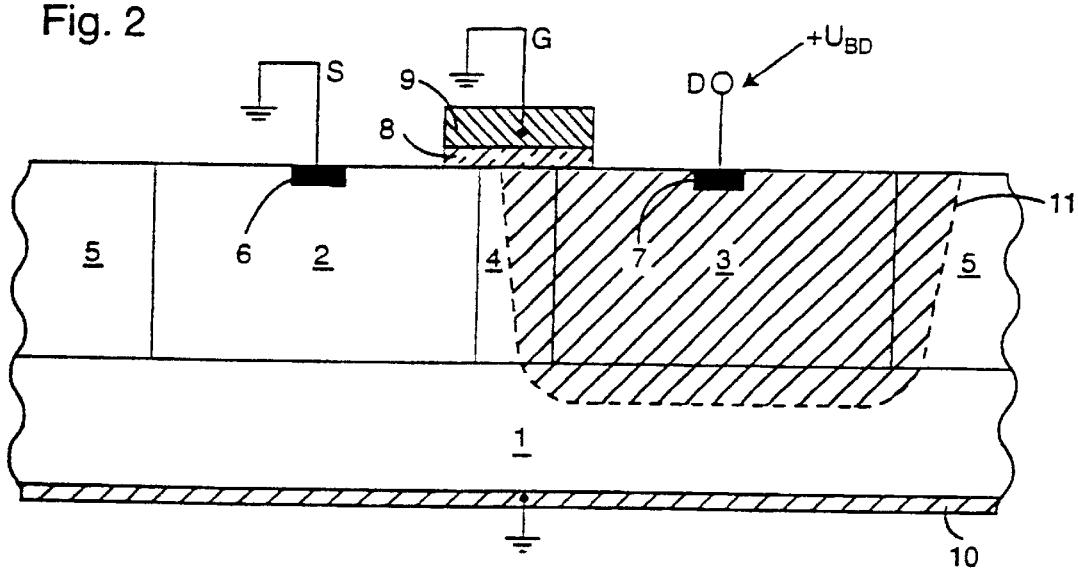
FIG. 2 is a schematic section through the junction-isolated lateral MOSFET of FIG. 1 in the off state.
Figure 3:
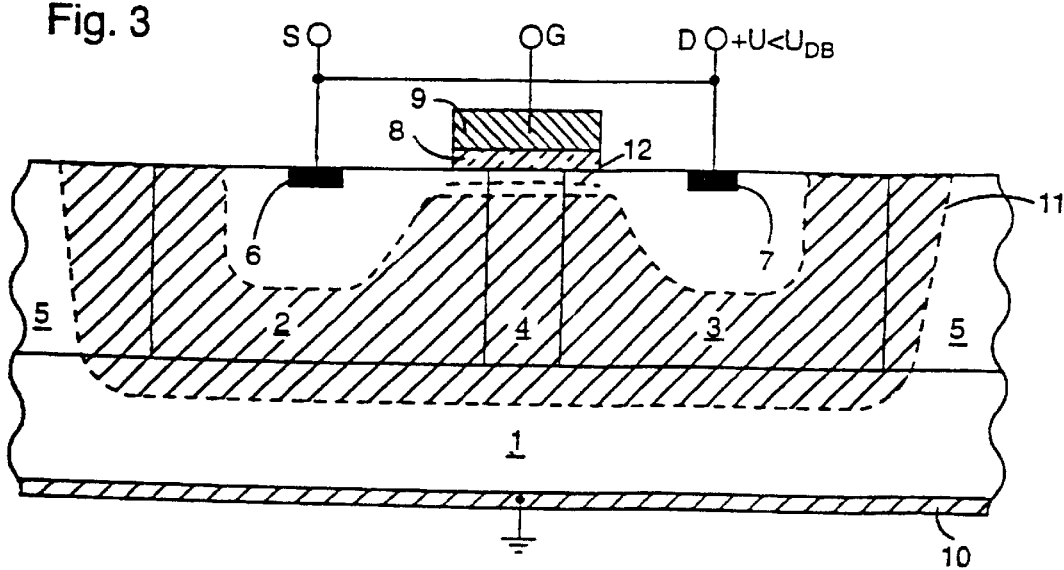

If only the drain side is at a high voltage $+U_{BD}$, as is shown in FIG. 2, whereas the source electrode S and the gate connection G are grounded, then the region 4 is only partially depleted and a space charge zone 11 remains (cf. FIG. 2).

However, if high voltages U which lie below the breakdown voltage $U_{DB}$ are applied to both electrodes D and S, and if the gate electrode G has applied to it +10 V, for example, relative to the electrodes S and D, then the region 4 is fully depleted from both sides, that is to say from the side of the drain zone 3 and the side of the source zone 2, which already occurs at a relatively low voltage. This eliminates an increase in the threshold voltage of the lateral MOSFET as a result of the body effect. The potential barrier in the depleted region 5 then furthermore isolates the transported charge carriers from the source side and the drain side. This state is shown in FIG. 3 with the channel switched on (cf. dashed line 12).

Figure 4:
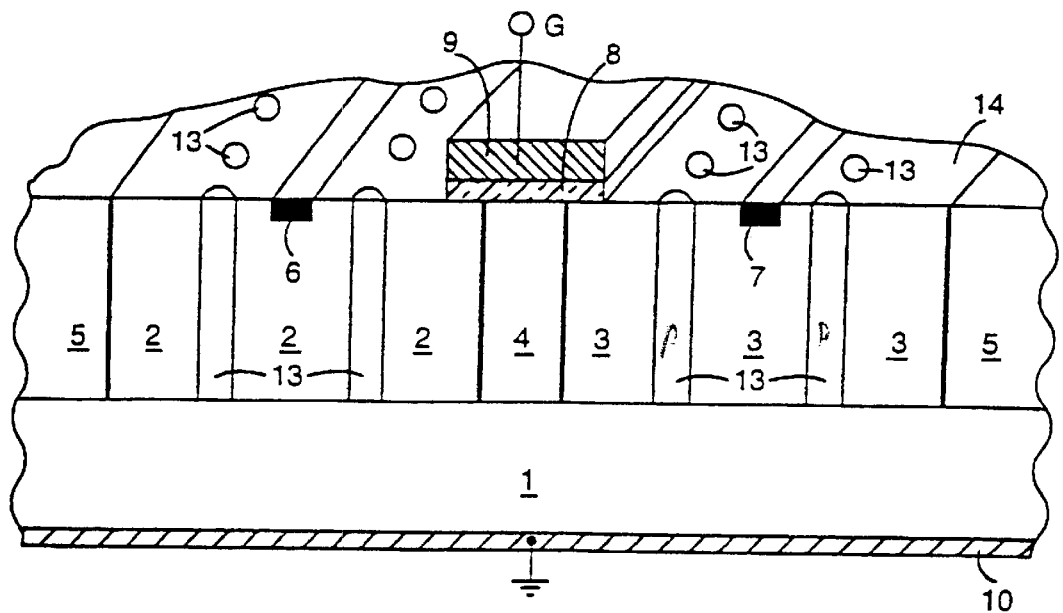
FIG. 4 is a perspective sectional view of a further exemplary embodiment of the junction-isolated lateral MOSFET according to the invention with pillar-like regions incorporated in the source zone and the drain zone, the regions extending perpendicularly to the main surfaces.

FIG. 4 shows a further exemplary embodiment of the lateral MOSFET according to the invention. In this case, additional pillar-shaped p-conducting regions 13 are embedded in the source zone 2 and, respectively, the drain zone 3 in such a way that these regions 13 extend between the first main surface 14 and the p-conducting regions substrate 1. Instead of these pillar-like regions 13, it is also possible to provide pillar-like p-conducting regions 14 that run horizontally, as is shown in the exemplary embodiment of FIG. 5. These pillar-like regions 13 or 14 produce low-impedance structures since they act as compensation charges and thus allow a higher n-type doping in the source zone and, respectively, in the drain zone 3.

Figure 5:
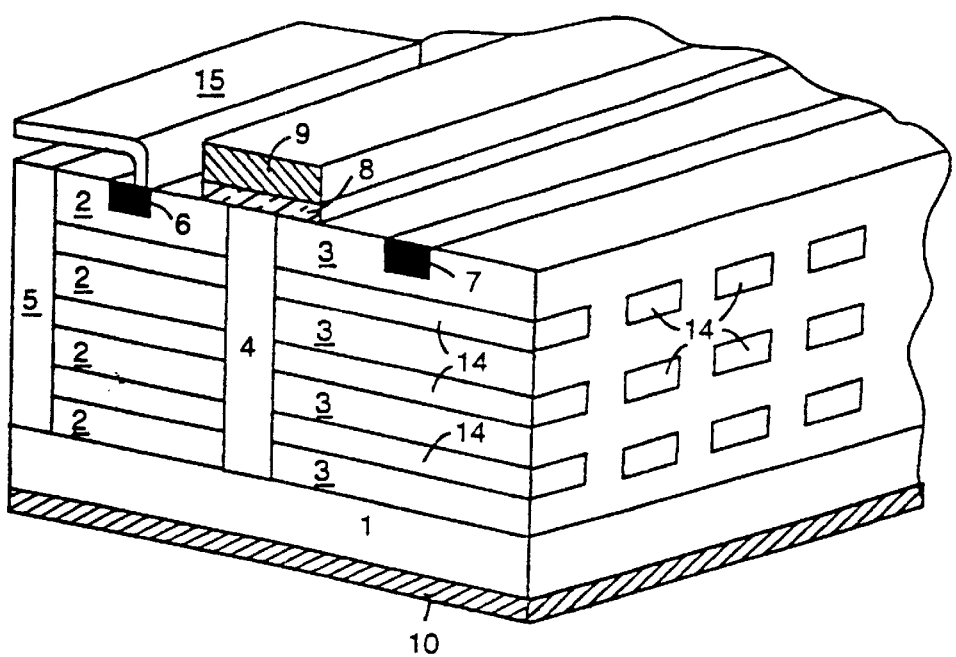
FIG. 5 is a perspective sectional view of a further exemplary embodiment of the junction-isolated lateral MOSFET according to the invention with pillar-like regions incorporated in the source zone and the drain zone, the regions extending parallel to the main surfaces.

If appropriate, the source zone 2 and the drain zone 3 may additionally be provided with field plates 15, as is shown in FIG. 5 for the source zone 2.

The invention thus enables a lateral MOSFET for high-/low-side switches which is junction-isolated by the p-conducting region 5 and the substrate 1, wherein case this MOSFET can be used for relatively high voltages in excess of 50 to 100 V and can be integrated without major problems.

The conductivity types specified in the above exemplary embodiments can be respectively interchanged. It is also possible to use a different semiconductor material instead of silicon, if appropriate.

I claim:

1. A junction-isolated lateral MOSFET for a high-/low-side switch, comprising:

a semiconductor body of a first conductivity type;

a first main surface and a second main surface substantially opposite said first main surface;

a source zone and a drain zone each of a second conductivity type extending from said first main surface at a distance from one another into said semiconductor body;

a surrounding region of the first conductivity type surrounding said drain zone and said source zone at an outer periphery thereof;

an insulating layer and a gate electrode disposed on said first main surface in a region between said source zone and said drain zone;

a ground connection grounding said semiconductor body at said second main surface;

a region of the first conductivity type extending between said source zone and said drain zone from said first main surface into said semiconductor body, said region of said first conductivity type having a doping concentration between a doping concentration for a breakdown charge and twice the doping concentration for the breakdown charge.

2. The junction-isolated lateral MOSFET according to claim 1, which comprises pillar-shaped regions of the first conductivity type extending from said first main surface to said semiconductor body and embedded in said source zone and said drain zone.

3. The junction-isolated lateral MOSFET according to claim 1, which comprises pillar-shaped regions of the first conductivity type extending parallel to said first and second main surfaces and embedded in said source zone and said drain zone.

4. The junction-isolated lateral MOSFET according to claim 1, which comprises field plates provided for at least one of said source zone and said drain zone.

* * * * *